US012803566B2

(12) United States Patent
Narayanan et al.

(10) Patent No.: US 12,803,566 B2
(45) Date of Patent: Nov. 17, 2026

(54) INCREASING PRECISION OF A RAMP-BASED ANALOG-TO-DIGITAL CONVERTER

(71) Applicant: INTERNATIONAL BUSINESS MACHINES CORPORATION, Armonk, NY (US)

(72) Inventors: Pritish Narayanan, San Jose, CA (US); Abhairaj Singh, Adliswil (CH)

(73) Assignee: International Business Machines Corporation, Armonk, NY (US)

(*) Notice: Subject to any disclaimer, the term of this patent is extended or adjusted under 35 U.S.C. 154(b) by 112 days.

(21) Appl. No.: 18/812,951

(22) Filed: Aug. 22, 2024

(65) Prior Publication Data

US 2026/0058666 A1 Feb. 26, 2026

(51) Int. Cl.
*H03M 1/06* (2006.01)
*G06F 7/544* (2006.01)

(52) U.S. Cl.
CPC ........ *H03M 1/0607* (2013.01); *G06F 7/5443* (2013.01)

(58) Field of Classification Search
CPC .................................................. H03M 1/0607
See application file for complete search history.

(56) References Cited

U.S. PATENT DOCUMENTS 6,333,706 B1 12/2001 Cummings et al.
10,027,339 B2 7/2018 Ding
10,284,216 B1 5/2019 Chung
10,742,226 B1 8/2020 Chen
11,239,852 B2 2/2022 Pu
11,909,410 B2 2/2024 Bal
11,955,984 B2 4/2024 Nagarajan
12,021,541 B2 6/2024 Huynh
2003/0174083 A1 9/2003 Mayfield
2008/0150772 A1* 6/2008 Cao .................... H03M 1/1061 341/120

(Continued)

FOREIGN PATENT DOCUMENTS

CN 101212228 A 7/2008
CN 109885121 A 6/2019

(Continued)

OTHER PUBLICATIONS

Shen, Q. et al., "A Capacitive Mismatch Calibration Method For SAR ADCs Based On TDC", Electronic Letters (2024), vol. 60:4, 4 pgs.

(Continued)

*Primary Examiner* — Lam T Mai
(74) *Attorney, Agent, or Firm* — Harrity & Harrity, LLP

(57) ABSTRACT

A system includes an analog-to-digital converter (ADC), a current source, and a controller. The ADC includes a comparator having a first input and a second input, and the current source includes an operational transconductance amplifier. The controller is configured to configure the operational transconductance amplifier with a first set of conductances; and use the current source to set a DC voltage at the first input. The controller is further configured to reconfigure the amplifier with a second set of conductances; and enable the comparator and use the current source to create a voltage ramp at the second input.

25 Claims, 10 Drawing Sheets

(56) References Cited

U.S. PATENT DOCUMENTS

| | | | | |
|---|---|---|---|---|
| 2009/0167587 | A1 * | 7/2009 | Xu | H03M 1/466 341/172 |
| 2009/0243907 | A1 * | 10/2009 | Nazemi | H03M 1/1042 341/161 |
| 2010/0156681 | A1 * | 6/2010 | Christ | H03M 1/109 341/120 |
| 2012/0268301 | A1 * | 10/2012 | Thachile | H03M 1/1061 341/158 |
| 2017/0117914 | A1 | 4/2017 | Choi | |
| 2022/0216882 | A1 | 7/2022 | Shikata | |
| 2023/0011449 | A1 | 1/2023 | Lee | |
| 2023/0012330 | A1 | 1/2023 | Michel | |
| 2023/0208429 | A1 | 6/2023 | Molina | |
| 2023/0387932 | A1 | 11/2023 | Rajagopal | |
| 2024/0097693 | A1 | 3/2024 | Kundu | |
| 2024/0154620 | A1 * | 5/2024 | Yonar | H03M 1/145 |

FOREIGN PATENT DOCUMENTS

| | | | |
|---|---|---|---|
| TW | 200737702 | A | 10/2007 |
| WO | 2020/208333 | A1 | 10/2020 |
| WO | 2026/041934 | A1 | 2/2026 |

OTHER PUBLICATIONS

Sun, L. et al., "A Fast Mismatch Calibration Method Based On Frequency Domain Orthogonal Decompostion For Time-Interleaved Analog-To-Digital Converters", Electronics (2023), vol. 12, 21 pgs.

Bagheri, M. et al., "A Mismatch Calibration Technique For SAR ADCs Based On Deterministic Self-Calibration And Stochastic Quantization", IEE Transactions on Circuits and Systems (2020), vol. 67:9, pp. 2883-2896.

Xiong, W. et al., "A Novel Fully Digital Feedforward Background Calibration Technique For Timing Mismatch In M-Channel Time-Interleaved ADCs", Electronics (2023), vol. 12, 20 pgs.

Jdrzejewski, K. et al., "Consideration Of Component Imperfections In New Digitally Assisted Sub-Ranging A/D Converters", Proceedings of SPIE (2013), 10 pgs.

Khaddam-Aljameh, R. et al., "HERMES Core-A 1.59 TOPS/mm2 PCM on 14nm CMOS In-Memory Compute Core using 300ps/LSB Linearized CCO-based ADCs", IEEE Journal of Solid-State Circuits (2022), vol. 57:4, pp. 1027-1038.

International Searching Authority, "Notification of Transmittal of the International Search Report and the Written Opinion of the International Searching Authority, or Declaration," Patent Cooperation Treaty Nov. 11, 2025, 06 pages, International Application No. PCT/IB2025/057196.

* cited by examiner

INCREASING PRECISION OF A RAMP-BASED ANALOG-TO-DIGITAL CONVERTER

BACKGROUND

Technical Field

The present disclosure generally relates to analog-to-digital converters (ADCs), and more particularly, to increasing ADC precision without the use of dedicated calibration circuits.

Description of the Related Art

Matrix multiplication is performed in machine learning, graphics processing, scientific computations, Internet searching, etc. Matrix multiplication may be performed in the digital domain by parallel processing units, or it may be performed in the analog domain by multiply and accumulate (MAC) units. MAC units offer greater power efficiency than digital processing units.

For certain applications, outputs of the MAC units are converted from the analog domain to the digital domain. Consider the example of a semiconductor chip that implements a deep neural network (DNN). MAC units are arranged in tiles and configured to perform matrix multiplication in the analog domain. Outputs of the MAC units are converted to the digital domain, where auxiliary functions such as attention mechanism, normalization, and certain activation functions are performed.

Such a semiconductor chip might have thousands of moderate resolution ADCs for performing the analog-to-digital conversion. Ramp-based ADCs may be used, as they are fast and efficient. ADC precision may be increased by dedicated circuits that perform careful calibration to eliminate slope and offset effects arising from manufacturing variability.

SUMMARY

According to various embodiments, a system includes an ADC, a current source, and a controller. The ADC includes a comparator having a first input and a second input, and the current source includes an operational transconductance amplifier. The controller is configured to configure the operational transconductance amplifier with a first set of conductances, and use the current source to set a DC voltage at the first input. The controller is further configured to reconfigure the amplifier with a second set of conductances, enable the comparator, and use the current source to create a voltage ramp at the second input.

In some embodiments, the system further includes an analog multiply and accumulate (MAC) unit, which includes the current source. The current source is configured to generate a current that is proportional to an analog quantity representing an output of the MAC unit.

In some embodiments, the MAC unit further includes a first set of resistance-based memory units providing the first set of conductances, and a first set of activation switches for activating the first set of memory units to configure the operational transconductance amplifier with the first set of conductances.

In some embodiments, the first set of activation switches is configured to receive a first set of control signals. The first set of control signals represents a first vector. States of the first subset of the memory units represent a second vector.

The output of the MAC unit represents a dot product of the first vector and the second vector.

In some embodiments, each memory unit is operatively coupled between a common node and a corresponding activation switch. The operational transconductance amplifier is configured to maintain the common node at a read voltage, and the output of the MAC unit is a function of the read voltage and a sum of the conductances of the first set of memory units.

In some embodiments, the ADC further includes a time-to-digital converter operatively coupled to an output of the comparator. The time-to-digital converter includes an oscillator. The controller is further configured to tune the second set of conductances to adjust slope of the voltage ramp to compensate for variability of the oscillator.

In some embodiments, the MAC unit further includes a second set of resistance-based memory units. The second set provides the second set of conductances. The MAC unit further includes a second set of activation switches for activating the second set of memory units to reconfigure the operational transconductance amplifier. The tuning includes de-activating the first subset of memory units, activating the second set of memory units, and iteratively tuning resistive states of the second set of memory units until the ADC produces a digital count that accurately represents a known voltage at the first input.

In some embodiments, the system further includes a digital processor configured to apply an activation function to an output of the ADC.

In some embodiments, the ADC further includes a first integrator operatively coupled to the first input, and a second integrator operatively coupled to the second input. Current from the current source is integrated by the first integrator to set the DC voltage at the first input. Current from the current source is integrated by the second integrator to create the voltage ramp at the second input.

In some embodiments, the controller is further configured to pre-charge the second integrator to a voltage that compensates for comparator offset.

In some embodiments, pre-charging the second integrator includes using the current source to set the first input at a nominal ramp start voltage, and using the current source to charge the second integrator to ramp up voltage at the second input until an output of the comparator reverses. Upon reversal, the second integrator is pre-charged to a voltage that compensates for comparator offset.

In some embodiments, the ADC includes a field effect transistor (FET) operatively coupling the current source to the second input, an oscillator, and a switch operatively coupling the comparator output between the oscillator and a gate of the FET. The FET is configured to connect the current source to the second input as the pre-charging begins, and the reversal of the comparator output causes the FET to disconnect the current source from the second input.

According to various embodiments, a method of operating a ramp-based ADC includes configuring an operational transconductance amplifier with a first set of conductances; using the configured amplifier to set a DC voltage at a first input of a comparator of the ADC; reconfiguring the amplifier with a second set of conductances; and enabling the comparator and using the reconfigured amplifier to create a voltage ramp at a second input of the comparator.

In some embodiments, the operational transconductance amplifier is provided by an in-memory MAC unit, and the first and second sets of conductances are provided by first and second sets of memory units of the MAC unit.

In some embodiments, the ADC further includes an oscillator operatively coupled to an output of the comparator. The method further includes tuning the second set of conductances to adjust slope of the voltage ramp to compensate for variability of the oscillator.

In some embodiments, the tuning includes setting a known DC volage at the first input of the comparator, and iteratively adjusting the second set of conductances until the ADC produces a digital count that accurately represents the known voltage.

In some embodiments, the method further includes pre-charging an integrator at the second input to a voltage that compensates for comparator offset.

According to various embodiments, a ramp-based ADC is operatively coupled to an output of an in-memory MAC unit. A method of increasing precision of the ADC includes setting a first input of a comparator of the ADC to a known voltage, and configuring an operational transconductance amplifier of the MAC unit with a set of resistance-based memory units of the MAC unit. The method further includes iteratively using the amplifier to apply a voltage ramp to a second input of the comparator, and tuning resistance states of the set until the ADC produces a digital count representing the known voltage.

In some embodiments, the known voltage is a full scale input voltage, and the digital count is a maximum digital count.

In some embodiments, the method further includes pre-charging an integrator at the second input to a voltage that compensates for comparator offset.

According to various embodiments, an ADC includes a comparator, an integrator, and a controller. The comparator has a first input and a second input, and the integrator is operatively coupled to the second input. The controller is configured to apply a nominal ramp start voltage at the first input, and apply a constant current to the integrator to create a voltage ramp at the second input. The voltage ramp starts at a voltage that is lower than the nominal ramp start voltage. The controller is further configured to discontinue applying the current when an output of the comparator reverses. As a result, the integrator is pre-set to a voltage that compensates for comparator offset.

In some embodiments, the ADC further includes an FET having a gate and a drain-source path. The drain-source path of the FET is operatively coupled to the second input. The output of the comparator is operatively coupled the gate of the FET.

According to various embodiments, a computing system includes a plurality of layers of a neural network. Each layer includes a plurality of processing tiles, a controller, and a digital processor programmed to apply activations functions to outputs of the processing tiles. Each processing tile includes a MAC unit including a first set of resistance-based memory units, a second set of resistance-based memory units, and a current source including an operational transconductance amplifier. Each processing tile further includes a ramp-based ADC operatively coupled to an output of the MAC unit. The ADC includes a comparator. For each processing tile, the controller is configured to configure the amplifier with the first set of memory units; use the configured amplifier to set a DC voltage at a first input of the comparator; reconfigure the amplifier with the second set of memory units; and enable the comparator and use the reconfigured amplifier to create a voltage ramp at a second input of the comparator.

In some embodiments, for each processing tile, the controller is further configured to iteratively tune resistive states of the second set of memory units until the ADC produces a digital count that accurately represents a known voltage at the first input.

In some embodiments, for each processing tile, the controller is further configured to pre-charge an integrator at the second input to a voltage that compensates for comparator offset.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview and Support

Figure 1:
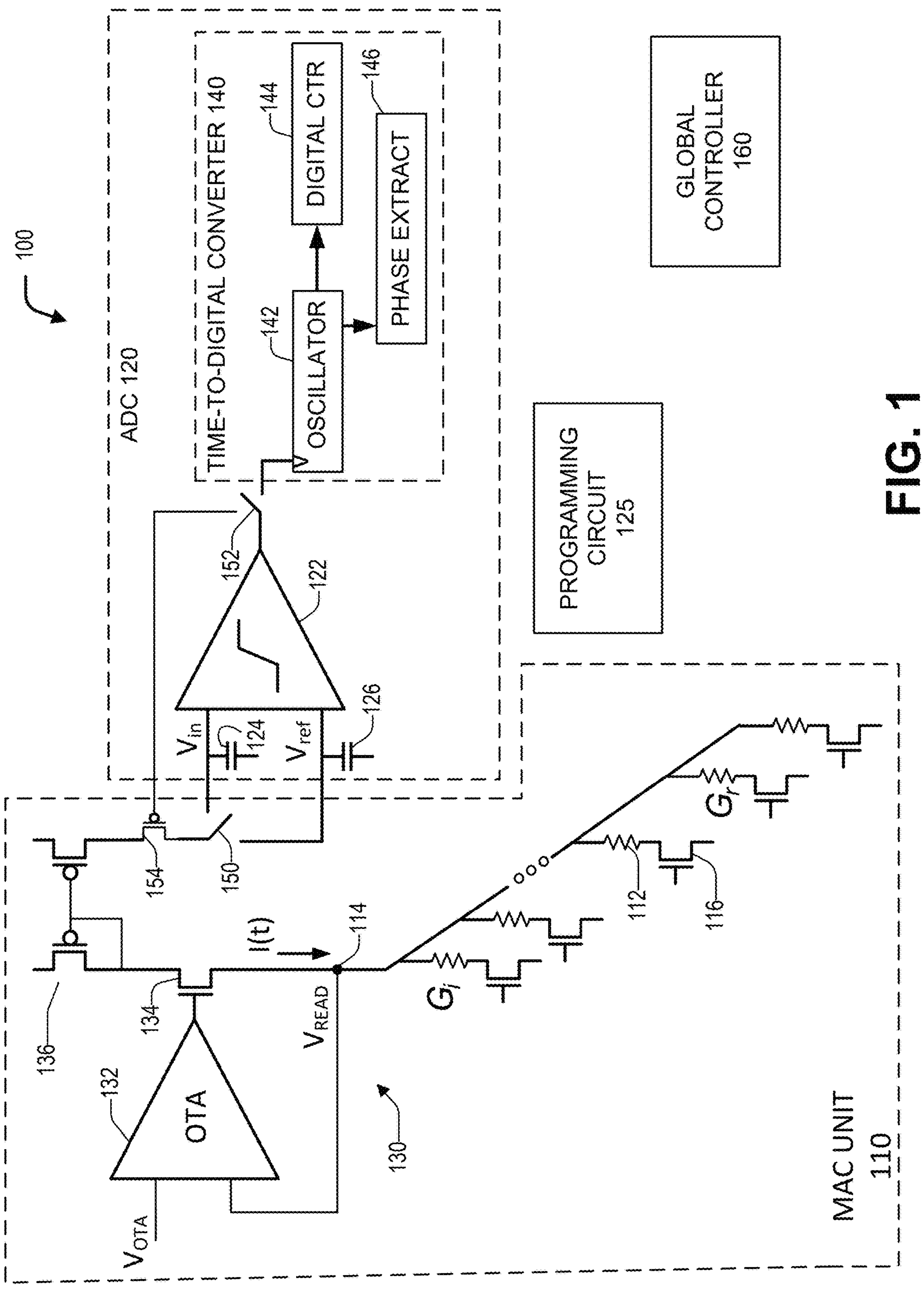
FIG. 1 is a circuit including a MAC unit and a ramp-based ADC, consistent with an illustrative embodiment.

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The present disclosure generally relates to increasing precision of ramp-based ADCs. By virtue of the concepts discussed herein, the precision is increased without the use of dedicated calibration circuits and on-chip infrastructure. As a result, less circuit area, complexity, and overhead are devoted to increasing ADC precision. These advantages are especially valuable for computing systems that employ many (e.g., thousands) of ADCs.

Advantageously, the impact of variabilities is reduced at every analog-to-digital conversion. Accuracy may be increased not only for manufacturing variability and long term degradation, but also for changes in operating environment (e.g., change in ambient temperature, change in altitude of operation).

According to an embodiment of the present disclosure, a system includes an ADC, a current source, and a controller. The ADC includes a comparator having a first input and a second input, and the current source includes an operational transconductance amplifier. The controller is configured to configure the operational transconductance amplifier with a first set of conductances; and use the current source to set a DC voltage at the first input. The controller is further configured to reconfigure the amplifier with a second set of conductances; and enable the comparator and use the current source to create a voltage ramp at the second input.

Using the same current source to set the DC voltage and create the voltage ramp reduces impact of variability in the current source. Thus, precision of the ADC is increased without the use of a dedicated calibration circuit. Further, the precision is increased as a part of the analog-to-digital conversion.

The system is suitable for using the current source of another unit. This further reduces circuit area devoted to increasing ADC precision.

In some embodiments, which can be combined with the preceding embodiment, the system further includes an analog MAC unit, which includes the current source. The current source is configured to generate a current that is proportional to an analog quantity representing an output of the MAC unit. Using the current source from the MAC unit further reduces the circuit area devoted to increasing the precision of the ADC.

In some embodiments, which can be combined with one or more preceding embodiments, the MAC unit further includes a first set of resistance-based memory units providing the first set of conductances; and a first set of activation switches for activating the first set of memory units to configure the operational transconductance amplifier with the first set of conductances.

In some embodiments, which can be combined with one or more preceding embodiments, the first set of activation switches is configured to receive a first set of control signals. The first set of control signals represents a first vector; states of the first subset of the memory units represent a second vector; and the output of the MAC unit represents a dot product of the first vector and the second vector.

In some embodiments, which can be combined with one or more preceding embodiments, each memory unit is operatively coupled between a common node and a corresponding activation switch. The operational transconductance amplifier is configured to maintain the common node at a read voltage, and the output of the MAC unit is a function of the read voltage and a sum of the conductances of the first set of memory units.

The in-memory MAC unit offers advantages over a conventional MAC unit. The in-memory MAC unit 110 moves less data faster and with lower power. Moreover, the in-memory MAC unit can be extended readily (by adding only a few memory units) to further increase the precision of the ADC.

In some embodiments, which can be combined with one or more preceding embodiments, the ADC further includes a time-to-digital converter operatively coupled to an output of the comparator. The time-to-digital converter includes an oscillator. The controller is further configured to tune the second set of conductances to adjust slope of the voltage ramp to compensate for variability of the oscillator. Advantageously, ADC precision is further increased without the use of a dedicated calibration circuit. Eliminating the dedicated calibration circuit further reduces cost, complexity and circuit area.

In some embodiments, which can be combined with one or more preceding embodiments, the MAC unit further includes a second set of resistance-based memory units. The second set provides the second set of conductances. The MAC unit further includes a second set of activation switches for activating the second set of memory units to reconfigure the operational transconductance amplifier. The tuning includes de-activating the first set of memory units; activating the second set of memory units; and iteratively tuning resistive states of the second set of memory units until the ADC produces a digital count that accurately represents a known voltage at the first input.

In this manner, the in-memory MAC unit is extended by adding only a few memory units (the second set). The resistive states are tuned quickly and simply, thus making it practical to perform the tuning prior to each analog-to-digital conversion.

In some embodiments, which can be combined with one or more preceding embodiments, the system further includes a digital processor configured to apply an activation function to an output of the ADC. Activation functions are used in neural networks. For a neural network that includes many MAC units and ADCs, the benefit of reducing the circuit area, complexity and overhead for each ADC is significant.

In some embodiments, which can be combined with one or more preceding embodiments, the ADC further includes a first integrator operatively coupled to the first input, and a second integrator operatively coupled to the second input. Current from the current source is integrated by the first integrator to set the DC voltage at the first input. Current from the current source is integrated by the second integrator to create the voltage ramp at the second input.

In some embodiments, which can be combined with one or more preceding embodiments, the controller is further configured to pre-charge the second integrator to a voltage that compensates for comparator offset.

In some embodiments, which can be combined with one or more preceding embodiments, pre-charging the second integrator includes using the current source to set the first input at a nominal ramp start voltage, and using the current source to charge the second integrator to ramp up voltage at the second input until an output of the comparator reverses. Upon reversal, the second integrator is pre-charged to a voltage that compensates for comparator offset.

Advantageously, compensation for comparator offset is performed without the use of a dedicated calibration circuit. Eliminating the dedicated calibration circuit further reduces cost, complexity and circuit area.

In some embodiments, which can be combined with one or more preceding embodiments, the ADC includes an FET operatively coupling the current source to the second input, an oscillator, and a switch operatively coupling the comparator output between the oscillator and a gate of the FET. The FET is configured to connect the current source to the second input as the pre-charging begins, and the reversal of the comparator output causes the FET to disconnect the current source from the second input. This is a passive approach that has little impact on circuit area as it involves the addition and control of only two switches.

According to an embodiment of the present disclosure, a method of operating a ramp-based ADC includes configuring an operational transconductance amplifier with a first set of conductances; using the configured amplifier to set a DC voltage at a first input of a comparator of the ADC; reconfiguring the amplifier with a second set of conductances; and enabling the comparator and using the reconfigured amplifier to create a voltage ramp at a second input of the comparator.

Using the same current source to set the DC voltage and create the voltage ramp reduces impact of variability in the current source. Thus, precision of the ADC is increased without the use of a dedicated calibration circuit. Further, the precision is increased as a part of the analog-to-digital conversion.

In some embodiments, which can be combined with the preceding embodiment, the operational transconductance amplifier is provided by an in-memory MAC unit, and the first and second sets of conductances are provided by first and second sets of memory units of the MAC unit. Using the current source from the MAC unit further reduces the circuit area devoted to increasing the precision of the ADC.

In some embodiments, which can be combined with one or more preceding embodiments, the ADC further includes an oscillator operatively coupled to an output of the comparator. The method further includes tuning the second set of conductances to adjust slope of the voltage ramp to compensate for variability of the oscillator.

Advantageously, compensation of oscillator variability is achieved without the use of a dedicated calibration circuit. Eliminating the dedicated calibration circuit further reduces cost, complexity and circuit area.

In some embodiments, which can be combined with one or more preceding embodiments, the tuning includes setting a known DC volage at the first input of the comparator, and iteratively adjusting the second set of conductances until the ADC produces a digital count that accurately represents the known voltage.

In some embodiments, which can be combined with one or more preceding embodiments, the method further includes pre-charging an integrator at the second input to a voltage that compensates for comparator offset. Advantageously, compensation for comparator offset is achieved without the use of a dedicated calibration circuit. Eliminating the dedicated calibration circuit further reduces cost, complexity and circuit area.

According to an embodiment of the present disclosure, a ramp-based ADC is operatively coupled to an output of an in-memory MAC unit. A method of increasing precision of the ADC includes setting a first input of a comparator of the ADC to a known voltage; and configuring an operational transconductance amplifier of the MAC unit with a set of resistance-based memory units of the MAC unit. The method further includes iteratively using the amplifier to apply a voltage ramp to a second input of the comparator; and tuning resistance states of the set until the ADC produces a digital count representing the known voltage.

Advantageously, compensation of oscillator variability is achieved without the use of a dedicated calibration circuit. Eliminating the dedicated calibration circuit further reduces cost, complexity and circuit area.

In some embodiments, which can be combined with the preceding embodiment, the known voltage is a full scale input voltage, and the digital count is a maximum digital count.

In some embodiments, which can be combined with one or more preceding embodiments, the method further includes pre-charging an integrator at the second input to a voltage that compensates for comparator offset. Advantageously, compensation for comparator offset is achieved without the use of a dedicated calibration circuit. Eliminating the dedicated calibration circuit further reduces cost, complexity and circuit area.

According to an embodiment of the present disclosure, an ADC includes a comparator, an integrator, and a controller. The comparator has a first input and a second input, and the integrator is operatively coupled to the second input. The controller is configured to apply a nominal ramp start voltage at the first input, and apply a constant current to the integrator to create a voltage ramp at the second input. The voltage ramp starts at a voltage that is lower than the nominal ramp start voltage. The controller is further configured to discontinue the current when an output of the comparator reverses. As a result, the integrator is pre-set to a voltage that compensates for comparator offset.

Advantageously, compensation for comparator offset is achieved without the use of a dedicated calibration circuit. Eliminating the dedicated calibration circuit further reduces cost, complexity and circuit area.

In some embodiments, which can be combined with the preceding embodiment, the ADC further includes an FET having a gate and a drain-source path. The drain-source path of the FET is operatively coupled to the second input. The output of the comparator is operatively coupled the gate of the FET. This passive approach compensates for comparator offset with little impact on circuit area.

According to an embodiment of the present disclosure, a computing system includes a plurality of layers of a neural network. Each layer includes a plurality of processing tiles, a controller, and a digital processor programmed to apply activations functions to outputs of the processing tiles. Each processing tile includes a MAC unit including a set of resistance-based memory units, and a current source including an operational transconductance amplifier. Each processing tile further includes a ramp-based ADC operatively coupled to an output of the MAC unit. The ADC includes a comparator. For each processing tile, the controller is configured to configure the amplifier with the set of memory units; use the configured amplifier to set a DC voltage at a first input of the comparator; reconfigure the amplifier with a set of conductances, and enable the comparator and use the reconfigured amplifier to create a voltage ramp at a second input of the comparator. Less circuit area, complexity, and overhead are devoted to compensating for current source variability in each ADC.

In some embodiments, which can be combined with the preceding embodiment, for each processing tile, the controller is further configured to iteratively tune resistive states of the second set of memory units until the ADC produces a digital count that accurately represents a known voltage at the first input. Less circuit area, complexity, and overhead are devoted to compensating for oscillator variability in each ADC.

In some embodiments, which can be combined with one or more preceding embodiments, for each processing tile, the controller is further configured to pre-charge an integrator at the second input to a voltage that compensates for comparator offset. Less circuit area, complexity, and overhead are devoted to compensating for comparator offset in each ADC.

For a computing system including many ADCs, the reduction in cost, complexity and circuit area for compensating for just one current source variability, oscillator variability and comparator offset is significant. Compensating for all three is especially significant.

Moreover, compensation for oscillator variability and removal of offset are performed prior to each analog-to-digital conversion. Compensation for current source variability is performed during each analog-to-digital conversion.

Example Construction

Reference is made to FIG. 1, which illustrates a circuit 100 including a MAC unit 110 and a ramp-based ADC 120 operatively coupled to an output of the MAC unit 110. The ADC 120 converts analog outputs of the MAC unit 110 to digital values.

The MAC unit 110 of FIG. 1 is an "in-memory type." The MAC unit 110 includes a plurality of non-volatile memory units 112. Each memory unit 112 has a programmable conductance. Examples of the memory units 112 include resistive random access memory (RRAM), where the presence or absence of conductive filament determines the resistance state; spin transfer torque (STT) magnetic random access memory (MRAM), where parallel or anti-parallel magnetic orientations determines the resistance state, phase change memory (PCM), where crystalline or amorphous states determines the resistance state; and NAND/NOR flash, where absence or presence of gated electrons determines the resistance state. These memory units 112 can switch between the two resistance states to store 0 or 1 value. In some embodiments, the memory units 112 may also an intermediate resistance states.

Each memory unit 112 is operatively coupled between a common node 114 and a corresponding activation FET 116. Each memory unit 112 is activated by supplying a pulse to a gate of the corresponding activation FET 116.

A programming circuit 125 may be used to set the resistive states of the memory units 112, and read back the stored values to ensure that the stored values are correct. The activation FETs 116 may be used to select the memory units 112 to be programmed, and the programming circuit 125 may include a current driver for supplying current that sets the resistive states of the selected memory units 112.

The non-volatile memory units 112 are grouped as two subsets. The first subset of memory units is labeled Gi. The second subset of memory units 112 is labeled Gr.

The MAC unit 110 further includes a current source 130. The current source 130 may include an operational transconductance amplifier (OTA) 132, an FET 134, and a current mirror 136. The current source 130 is configured to generate a current I(t) that is proportional to an analog quantity representing an output of the MAC unit 110.

The OTA 132 is operatively coupled to a gate of the FET 134, and a drain-source path of the FET is operatively coupled between the common node 114 and the current mirror 136. With transconductance of the OTA 132 configured by activated memory units 112, current I(t) flowing into the common node 114 is mirrored via the current mirror 136. OTA current itself does not influence the value of the current I(t). Current on an output of the OTA 132 regulates the gate of the FET 134 to set the common node 114 at a constant voltage Vread.

Ideally, the current I(t)=Vread*ΣG, where ΣG is the sum of the conductances of the activated memory units 112. However, as discussed below, the current I(t) is not ideal.

The MAC unit 110 may be characterized as performing a dot product of two vectors. The MAC unit 110 receives a number M of input signals to control the activation FETs 116. Let an input vector A of length M represent the input signals, where $A=[a_1, \ldots a_M]$. Let a conductance vector B of length M represent the conductances, where $B=[b_1, \ldots b_M]$. The sum ΣG represents a dot product of vectors A and B.

The in-memory MAC unit 110 offers advantages over a conventional MAC unit. The in-memory MAC unit 110 moves less data faster and with lower power. The values stored in the memory units 112 are not moved, and a MAC operation is performed by accessing only the input signals. Power is lowered further for memory units 112 that can store intermediate values. An additional advantage of the in-memory MAC unit 110 will be discussed below.

The ADC 120 is ramp-based. The ADC includes a comparator 122 having a first input Vin and a second input Vref. When the comparator 122 is enabled, and when Vin>Vref, an output of the comparator 122 goes high. Otherwise, the output of the comparator 122 is low.

A first integrator (e.g., a first capacitor) 124 is operatively coupled to the first input Vin. The first integrator 124 is used to store a DC voltage that is proportional to an analog quantity representing an output of the MAC unit 110. A second integrator (e.g., a second capacitor) 126 is operatively coupled to the second input Vref. The second integrator 126 is used to create a voltage ramp at the second input Vref. The voltage ramp starts at a start voltage, and increases linearly over time.

When the comparator 122 is enabled and the voltage ramp is initially applied to the second input Vref, an output of the comparator goes high as Vin>Vref. The comparator output remains high until the ramp voltage at the second input Vref exceeds the DC voltage at the first input Vin. Thus, a pulse is formed on the output of the comparator 122, and width of that pulse represents a measure of the time for the ramp voltage to exceed the DC voltage.

The ADC 120 further includes a time-to-digital converter 140 for converting the pulse width to a digital value. For example, the time-to-digital converter 140 may include an oscillator 142 (e.g., a ring oscillator, a current-controlled oscillator) that, when enabled by the comparator output, runs at a fundamental frequency and generates a stable stream of pulses. Thus, while the comparator output is high (Vin>Vref), the oscillator 142 generates a stable stream of pulses. Once the ramp voltage exceeds the DC voltage (Vref>Vin), the comparator output goes low, and the oscillator 142 is disabled and stops generating pulses. The count of the digital pulses is proportional to the width of the pulse on the comparator output, which is proportional to the DC voltage at the first comparator input Vin. A digital counter 144 counts the number of pulses from the oscillator 142 to produce the digital value. In some embodiments, the digital counter 144 may be used to produce the most significant bits (MSBs) of a digital value, and a phase extraction circuit 146 may be used to produce the least significant bits (LSBs) of the digital value. The phase extraction circuit 146 accounts for the amount of incomplete oscillation of the oscillator 142 (the fractional part of the oscillator period).

Precision of the circuit 100 is affected by variabilities in the current source 130 and the oscillator 142. The current I(t) may be modeled as:

$$I(t) = Kr * Vread ** \sum G$$

where Kr is distortion due to variability in the OTA 132.

The DC voltage at the first input Vin may be modeled as $$V_c = \frac{1}{CK_C}\int I(t)dt,$$

where Kc represents variability in the first integrator 124. The term Kc is considered negligible and will be ignored hereinafter. Hereinafter, $$V_c = \frac{1}{C}\int I(i)dt,$$

The current mirror 136 may be modeled as 1:Km. The term Km is the distortion due to variability in the current mirror 136.

Slope of the ramp may be modeled as Ks*Sr. The term Ks represents variability in the slope.

Width ($t_w$) of the pulse on the comparator output may be modeled as $t_w$=(Vin/Sr)+Δ. The term Δ represents variability in the starting voltage of the voltage ramp.

The width of the pulse on the comparator output may be modeled as $t_w$=Vin/Sr, and the MSBs of the digital word may be modeled as MSB=$t_w$*$F_{osc}$*$K_{osc}$, where $F_{osc}$ is the fundamental frequency of the oscillator 142, and $K_{osc}$ represents distortion due to variability in the oscillator 142.

Combining these models, the digital output (OUT) of the ADC 12 may be represented as:

$$\text{OUT} = \left\{(F_{OSC} * K_{osc}) * 1/(C)K_m \int (V_{read} * K_r) * \sum G_i\, dt\right\} / (s_r * K_s).$$

The circuit 100 also includes first, and second switches 150 and 152 and an FET 154 for switching in various components of the MAC unit 110 to increase ADC precision. The first and second switches 150 and 152 are represented schematically as single pole double throw switches. In practice, they may be implemented with FETs.

A controller 160 may include logic circuits that are synchronized with a global clock for generating control and timing signals for operating the MAC unit 110 and the ADC 120 and increasing the precision of the ADC 120. These signals are responsible for MAC operation, calibration, toggling of different switches, MAC inputs, ADC output, buffering, etc. The controller 160 is characterized as global because it can control the operation of multiple MAC units 110 and ADCs 120.

Figure 2:
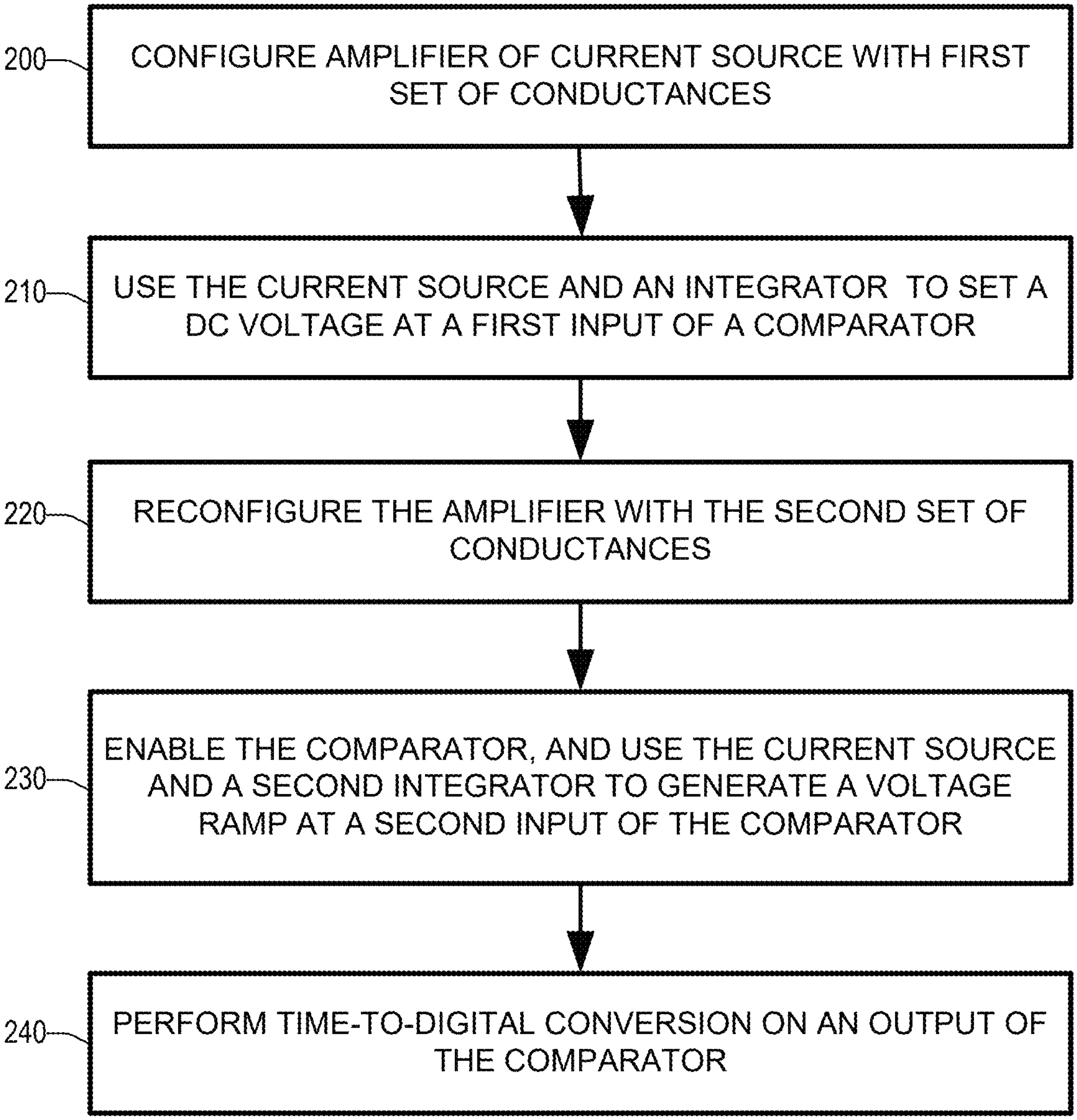
FIG. 2 is a method of increasing precision of a ramp-based ADC with respect to current source variability, consistent with an illustrative embodiment.
Figure 3A:
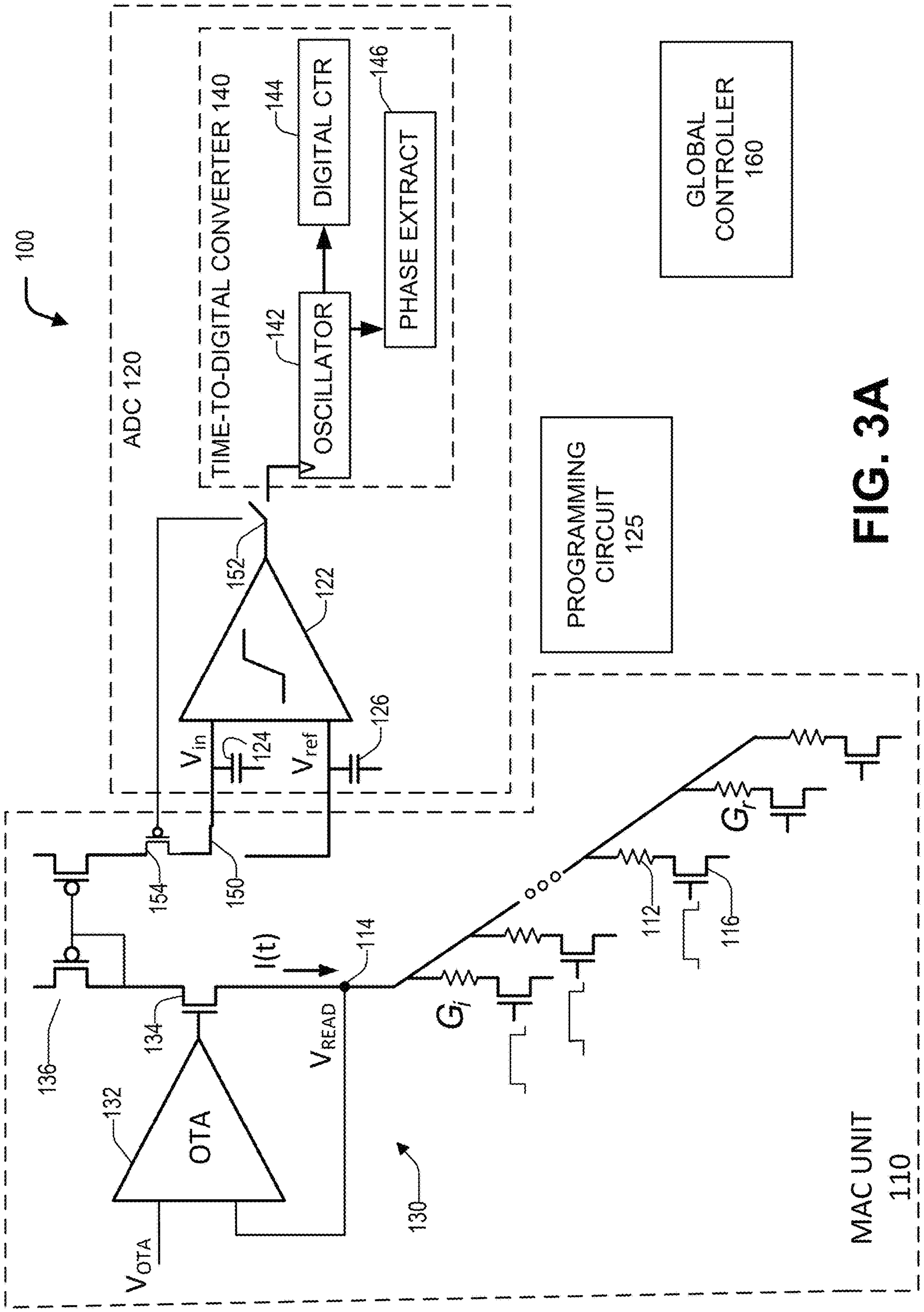
FIGS. 3A and 3B illustrate the circuit of FIG. 1 configured to increase precision of the ramp-based ADC with respect to current source variability, consistent with an illustrative embodiment.
Figure 3B:
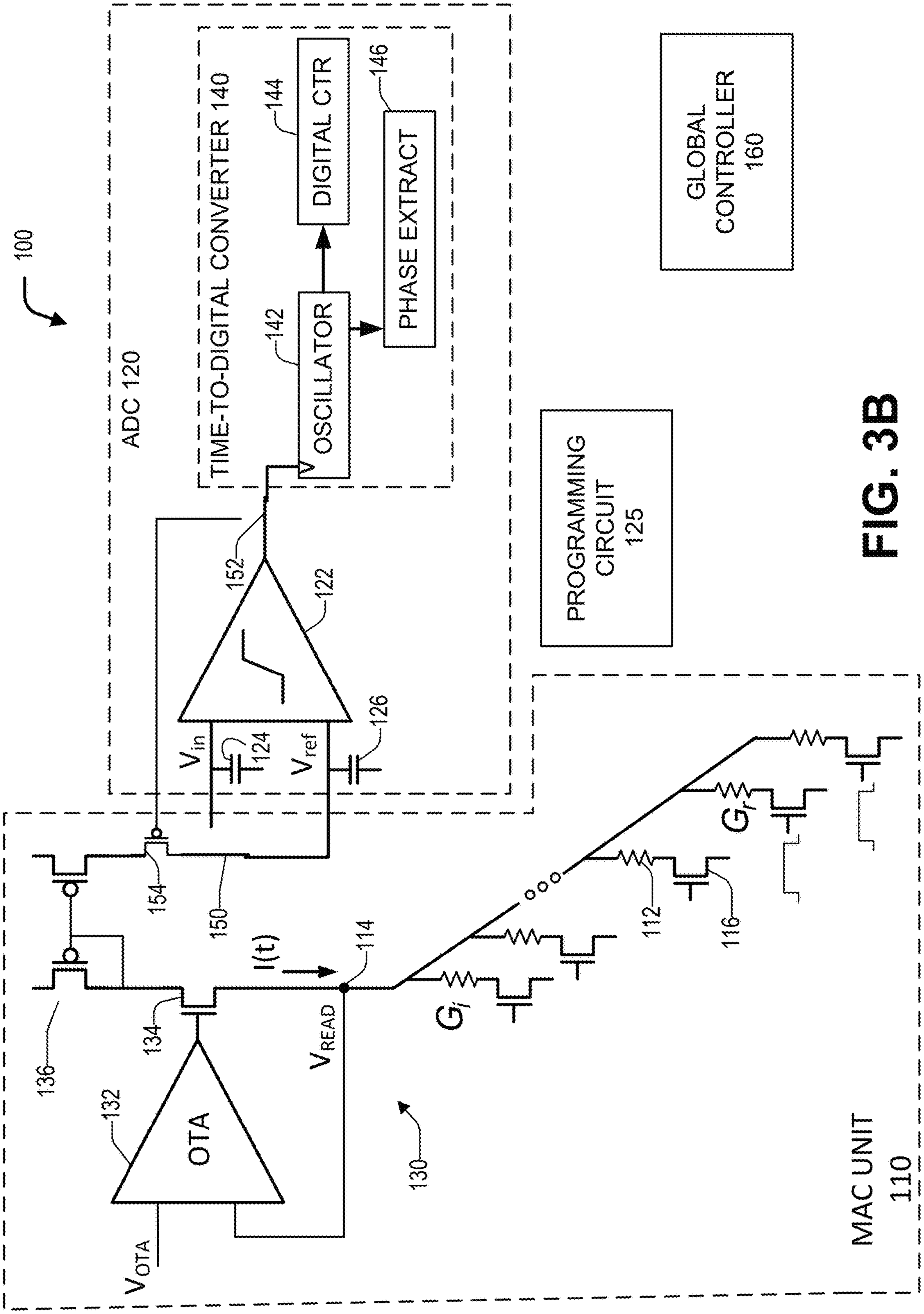

Reference is now made to FIGS. 2, 3A and 3B, which illustrate operation of the controller 160 to reduce the impact of variability in the current source 130 while controlling a MAC operation and conversion of an analog output of the MAC operation. At block 200 of FIG. 2, the current source 130 is configured with conductances of the first subset Gi of memory units 112 (the "first conductances"). Inputs are supplied to gates of the activation FETS 116 to turn on the first subset Gi of memory units 112 and turn off the second subset Gr of memory units 112. As result, the first subset Gi of memory units 112 are operatively coupled to the common node 114.

At block 210, with the comparator 122 disabled, a voltage VOTA is applied to the OTA 132, and a current I(t) is generated. The current I(t) is used to charge the first integrator 124 to set a DC voltage at the first input Vin of the comparator 122. The DC voltage is proportional to an analog quantity representing an output of the MAC unit 110.

Additional reference is made to FIG. 3A, which shows the circuit 100 configured to charge the first integrator 124. The first switch 150 operatively couples the current mirror 136 of the current source 130 to the first input Vin of the comparator 122.

At block 220 of FIG. 2, the current source 130 is reconfigured with conductances of the second subset Gr of memory units 112 (the "second conductances"). Inputs are supplied to gates of the activation FETS 116 to turn off the first subset Gi of memory units 112 and turn on the second subset Gr of memory units 112. As result, the second subset Gr of memory units 112 is operatively coupled to the common node 114.

At block 230, the comparator is enabled, a voltage VOTA is applied to the OTA 132, and the resulting current I(t) is used to charge the second integrator 126 to generate a voltage ramp at the second input Vref of the comparator 122.

Additional reference is made to FIG. 3B, which shows the circuit 100 configured to charge the second integrator 126 and create the voltage ramp at the second input Vref. The first switch 150 operatively couples the current mirror 136 to the second input Vref of the comparator 122, and the second switch 152 operatively couples the output of the comparator 122 to an enable input of the oscillator 142.

At block 240, the time-to-digital converter 140 converts a time pulse on the output of the comparator 122 to a digital value. While Vin>Vref, the oscillator 142 is enabled and generates a steady stream of pulses, and the digital counter 144 keeps a count of the oscillator pulses. Once the ramp voltage exceeds the DC voltage (Vref>Vin), the comparator output goes low, and the oscillator 142 is disabled. The count stored in the digital counter 144 represents the MSBs of a digital value representing the output of the MAC unit 110, and the phase extraction circuit 146 provides the LSBs of the digital value.

By using the current source to set the DC voltage at the first input Vin, and then using the same current source to create the voltage ramp at the second input Vref, distortions Kr, Km and Ks are cancelled out. The impact of current source variability is reduced without using a dedicated calibration circuit. Moreover the distortions Kr, Km and Ks are cancelled out with every analog-to-digital conversion.

The values stored in the second subset Gr of memory units 112 may be a priori values that set the ramp at a slope that reduces the impact of oscillator variability. However, the controller 160 may be configured to dynamically set the values stored in the second subset Gr of memory units prior to each analog-to-digital conversion, and thereby tune the slope to compensate for oscillator variability.

Figure 4:
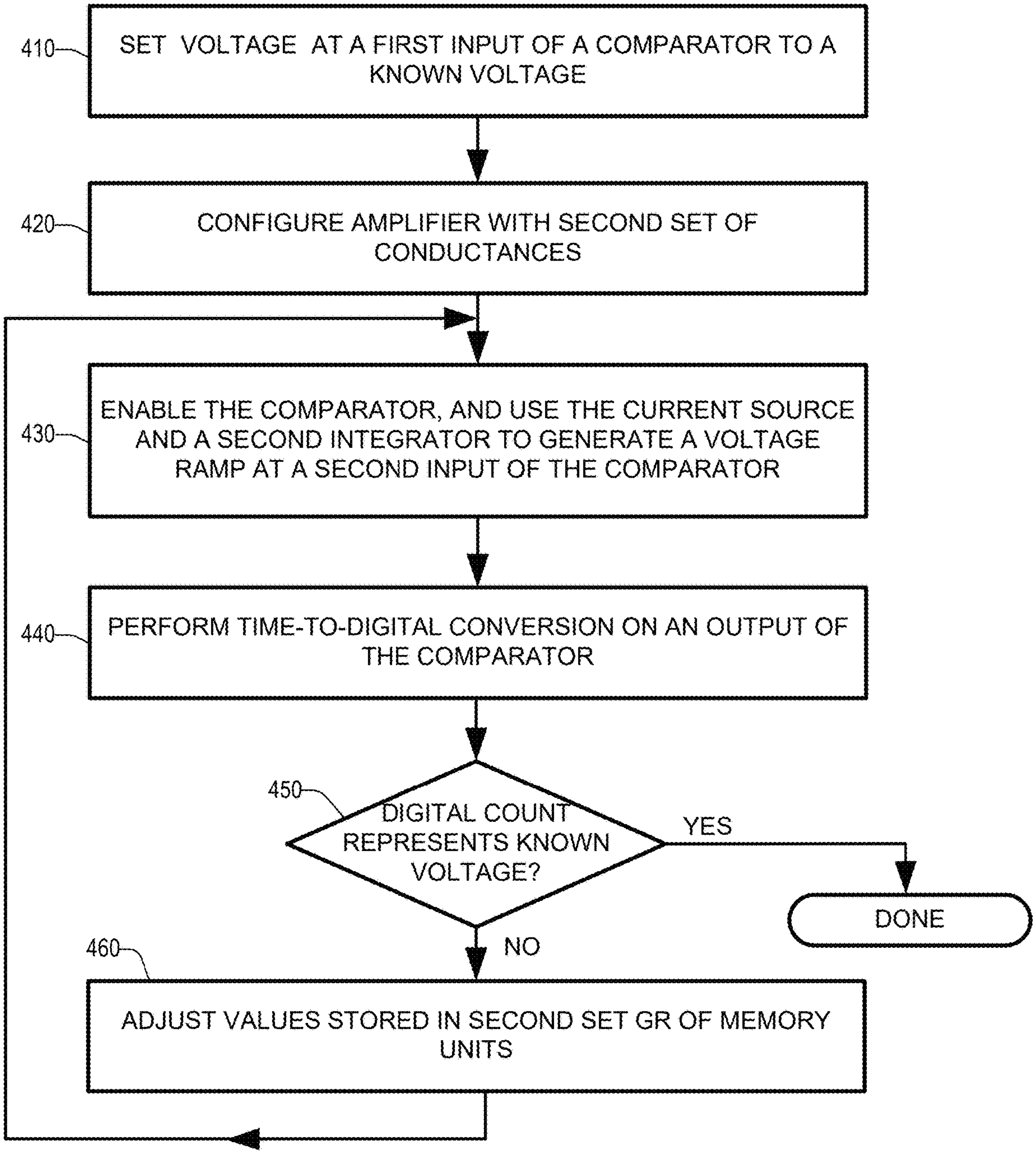
FIG. 4 is a method of increasing precision of a ramp-based ADC with respect to oscillator variability, consistent with an illustrative embodiment.
Figure 5A:
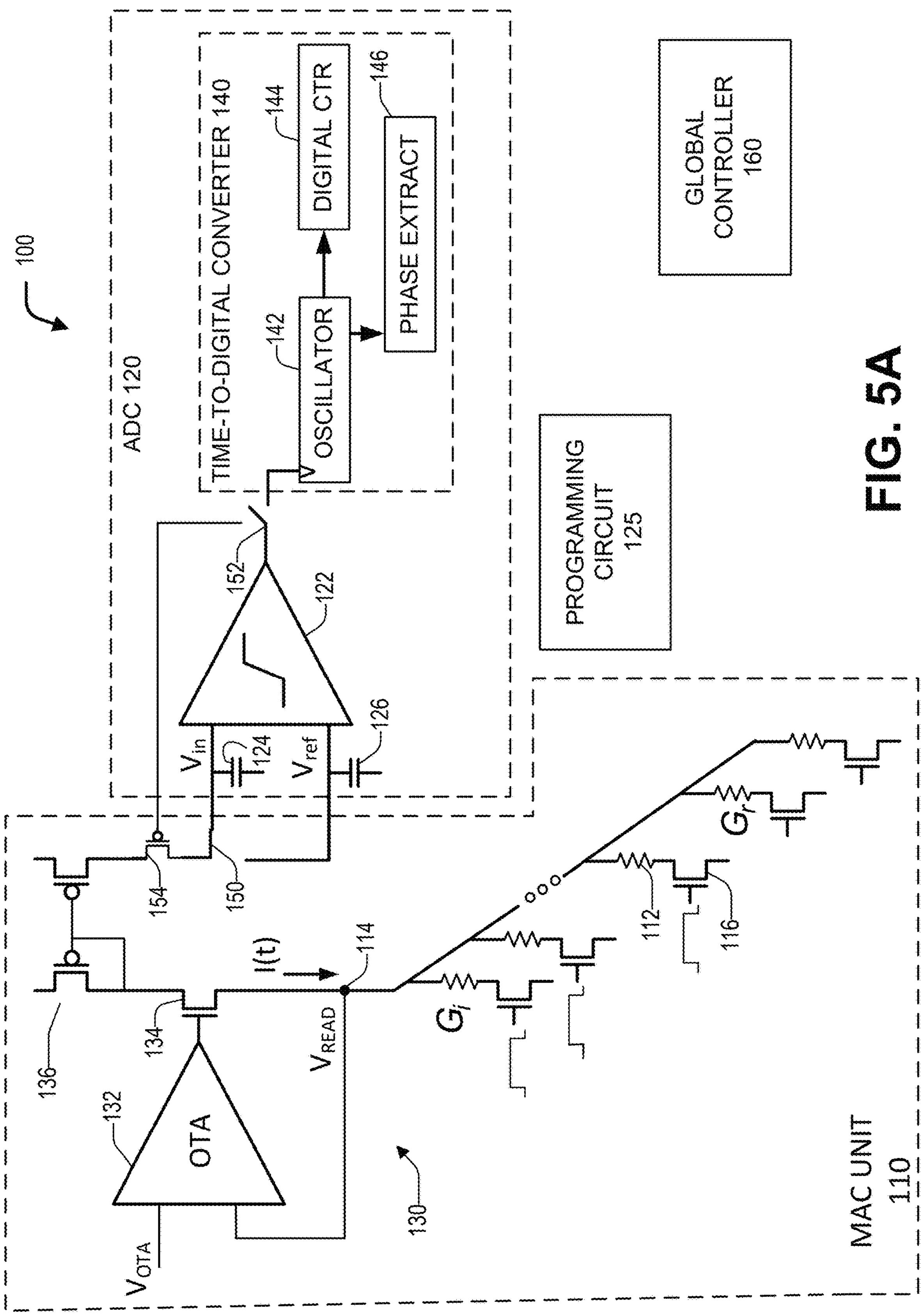
FIGS. 5A and 5B illustrate the circuit of FIG. 1 configured to increase precision of the ramp-based ADC with respect to oscillator variability, consistent with an illustrative embodiment.
Figure 5B:
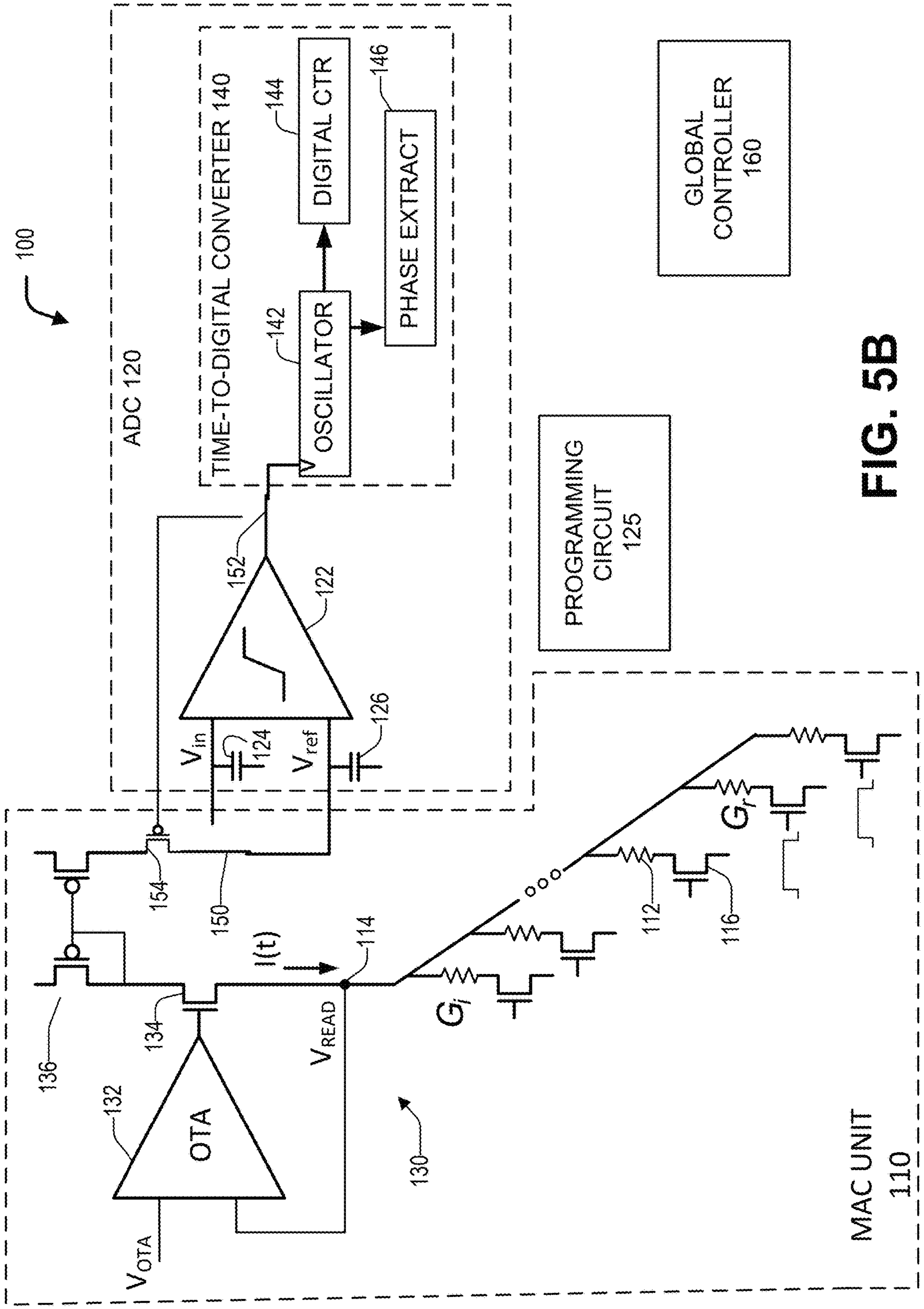

Reference is now made to FIGS. 4, 5A and 5B, which illustrates the tuning of the values stored in the second subset Gr of memory units 112. At block 410 of FIG. 4, the controller 160 sets the first input Vin of the comparator 122 to a known voltage, such as a full-scale analog voltage. The controller 160 cause the current source 130 to charge the first integrator 124 to the known voltage.

Additional reference is made to FIG. 5A, which shows the circuit 100 configured to set the known voltage at the first input Vin. The first switch 150 operatively couples the current mirror 136 to the first input of the comparator 122, and current from the current source 130 charges the first integrator 124 to the known voltage.

At block 420 of FIG. 4, the first subset Gi of memory units 112 is de-activated, and the second subset Gr of memory units is activated. As a result, the OTA 132 is configured with the second subset of conductances.

At block 430, the comparator 122 is enabled, and the current source 130 and the second integrator 126 are used to apply a voltage ramp to the second input Vref.

As shown in FIG. 5B, the activation FETS 116 corresponding to the second subset of memory units 112 are turned on, and the current I(t) is a function of the read voltage and ΣGr. The first switch 150 operatively couples the current mirror 136 to the second input Vref of the comparator 122. The current charges the second integrator 126 and causes a voltage ramp to be applied to the second input Vref.

At block 440, a time-to-digital conversion is performed. If the output of the ADC 120 does not produce a digital count representing the known voltage, the values stored in the second subset Gr of memory units 112 is adjusted to increase the slope of the voltage ramp (blocks 450 and 460), and control is returned to block 430. The values stored in the second subset Gr of memory units 112 are iteratively adjusted until the output of the ADC 120 produces a digital count representing the known voltage. If the known voltage is full scale analog voltage, the ADC should produce a maximum digital count.

In addition to compensating for variability in the current source 130 and the oscillator 142, the circuit 100 may be configured to reduce the impact of comparator offset to further increase precision of the ADC. Compensation for comparator offset is illustrated in FIGS. 6 and 7.

Figure 6:
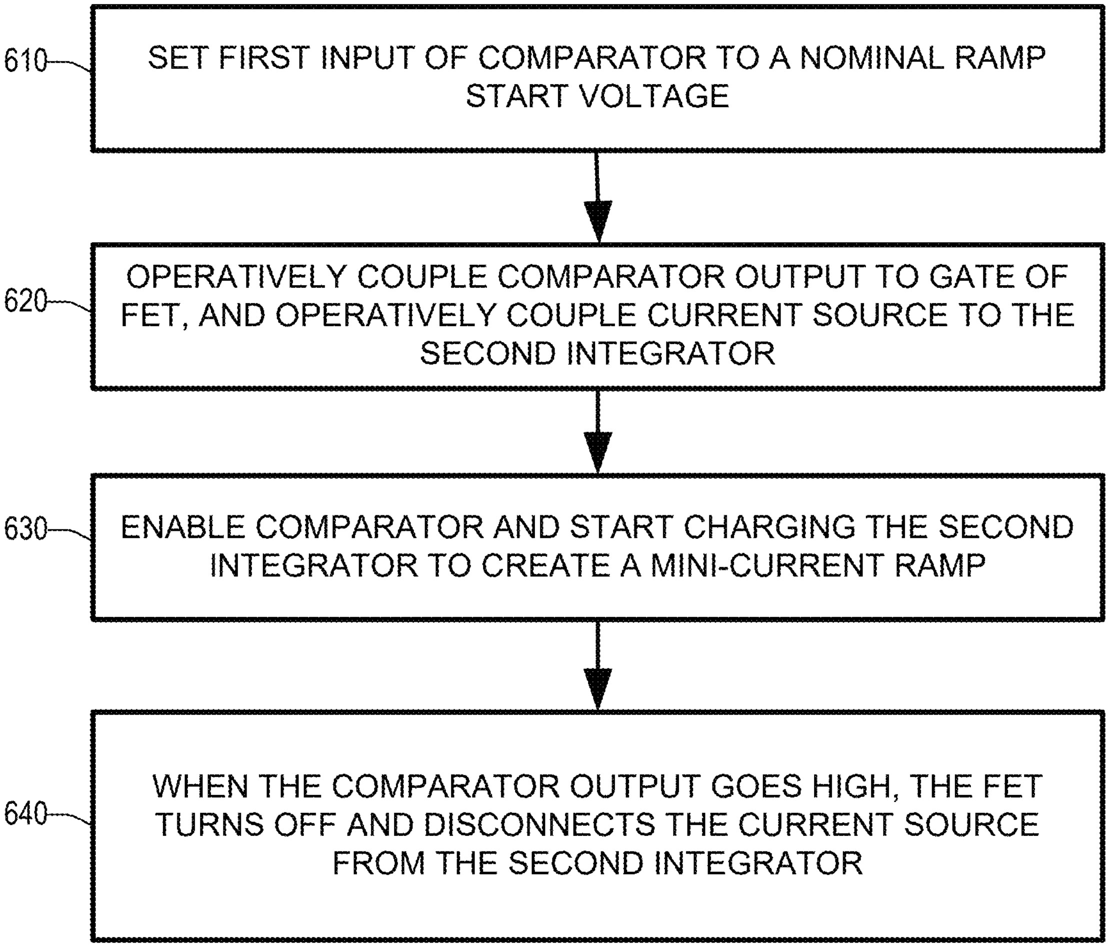
FIG. 6 illustrates a method of increasing precision of a ramp-based ADC with respect to voltage ramp offset, consistent with an illustrative embodiment.
Figure 7:
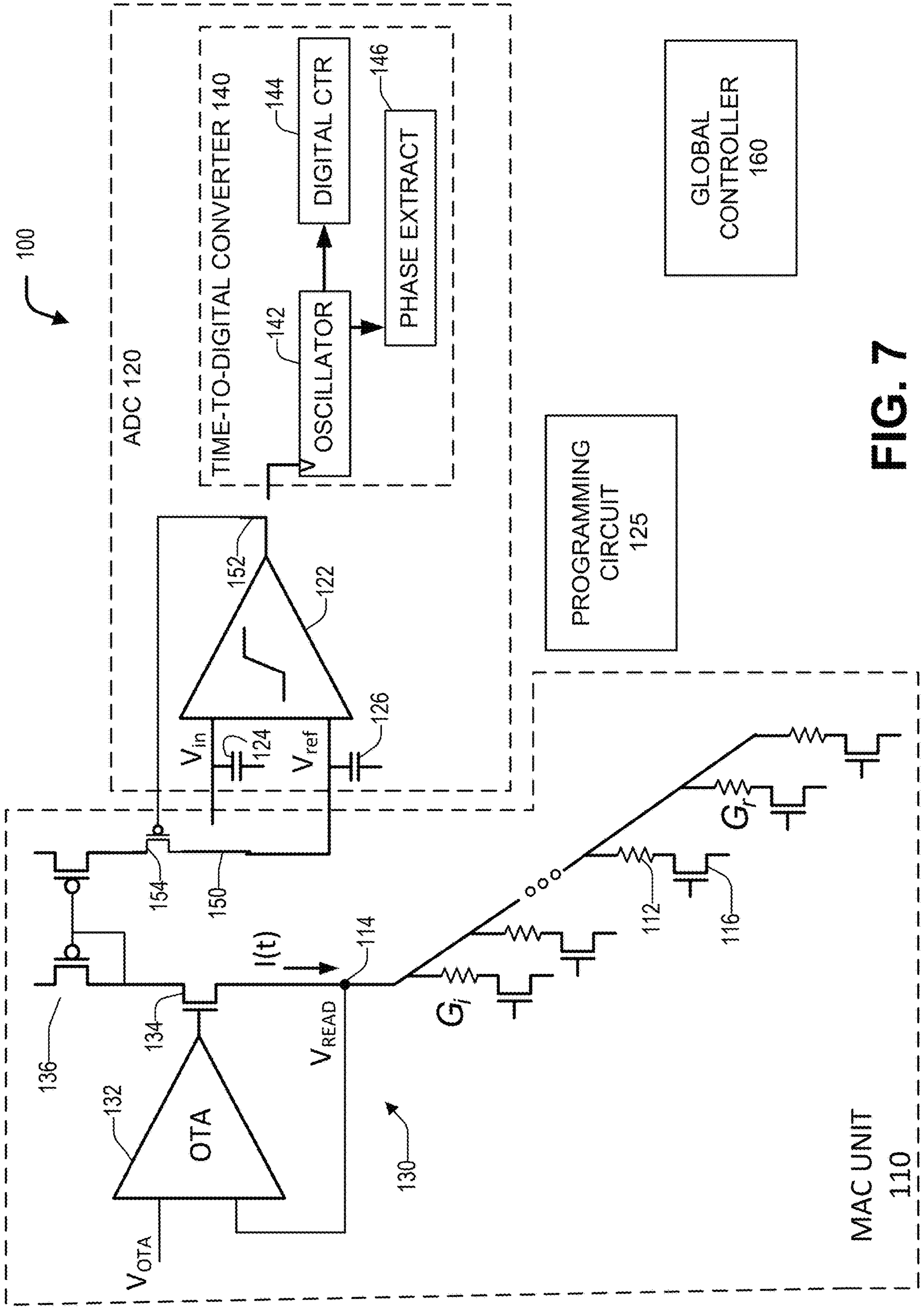
FIG. 7 illustrates the circuit of FIG. 1 configured to increase the precision of the ramp-based ADC with respect to voltage ramp offset, consistent with an illustrative embodiment.

Reference is made to FIGS. 6 and 7. At block 610 of FIG. 6, the controller 160 configures the circuit 100 to set the first input Vin of the comparator to a nominal ramp start voltage. This may be done by controlling the first switch 150 to operatively couple the current source 130 to the first integrator 124.

At block 620, the controller 160 configures the second switch 152 to operatively couple the comparator output to a gate of the FET 154, and it configures the first switch 150 to operatively couple the current source 130 to the second integrator 126. This is illustrated in FIG. 7.

At block 630, the controller 160 enables the comparator 122, whose low output causes the FET 154 to turn on. The current source 130 starts charging the second integrator 126 to create a mini-current ramp at the second input Vref of the comparator 122. The starting voltage of this mini-current ramp is below the nominal ramp starting voltage. For example, the starting voltage of the mini-current ramp may be about 30 mV below the nominal ramp starting voltage, and the min-ramp can increase to a maximum that is about 30 mV above the nominal ramp starting voltage.

At block 640, the mini-ramp voltage continues to ramp up. Once the output of the comparator 122 goes high and turns off the FET 154, the current source 130 is disconnected from the second input Vref of the comparator 122. The second integrator 126 is now pre-charged to a ramp start voltage that compensates for comparator offset.

Additional Example Constructions

FIG. 1 illustrates a circuit 100 that compensates for current source variability, oscillator variability, and comparator offset. In other embodiments, however, a circuit herein may compensate for current source variability and oscillator variability, but not comparator offset. In other embodiments, a circuit herein may compensate for current source variability and comparator offset, but not oscillator variability.

In still other embodiments, compensation for comparator offset may be performed alone. Moreover, the compensation for comparator offset is not limited to a MAC unit or other in-memory unit.

In some embodiments, a circuit herein that compensates for current source and oscillator variability is not limited to an in-memory MAC unit or other unit that include a current source and memory. A circuit herein could include dedicated current source and memory. However, costs associated with adding these dedicated circuits would be incurred.

Example Particularly Configured for Neural Networks

As noted above, the ability to increase ADC precision without the use of dedicated calibration circuits is advantageous, as less circuit area, complexity, and overhead are devoted to increasing the ADC precision. These advantages are especially valuable for computing systems that employ many ADCs. One such computing system is a deep neural network.

Figure 8:
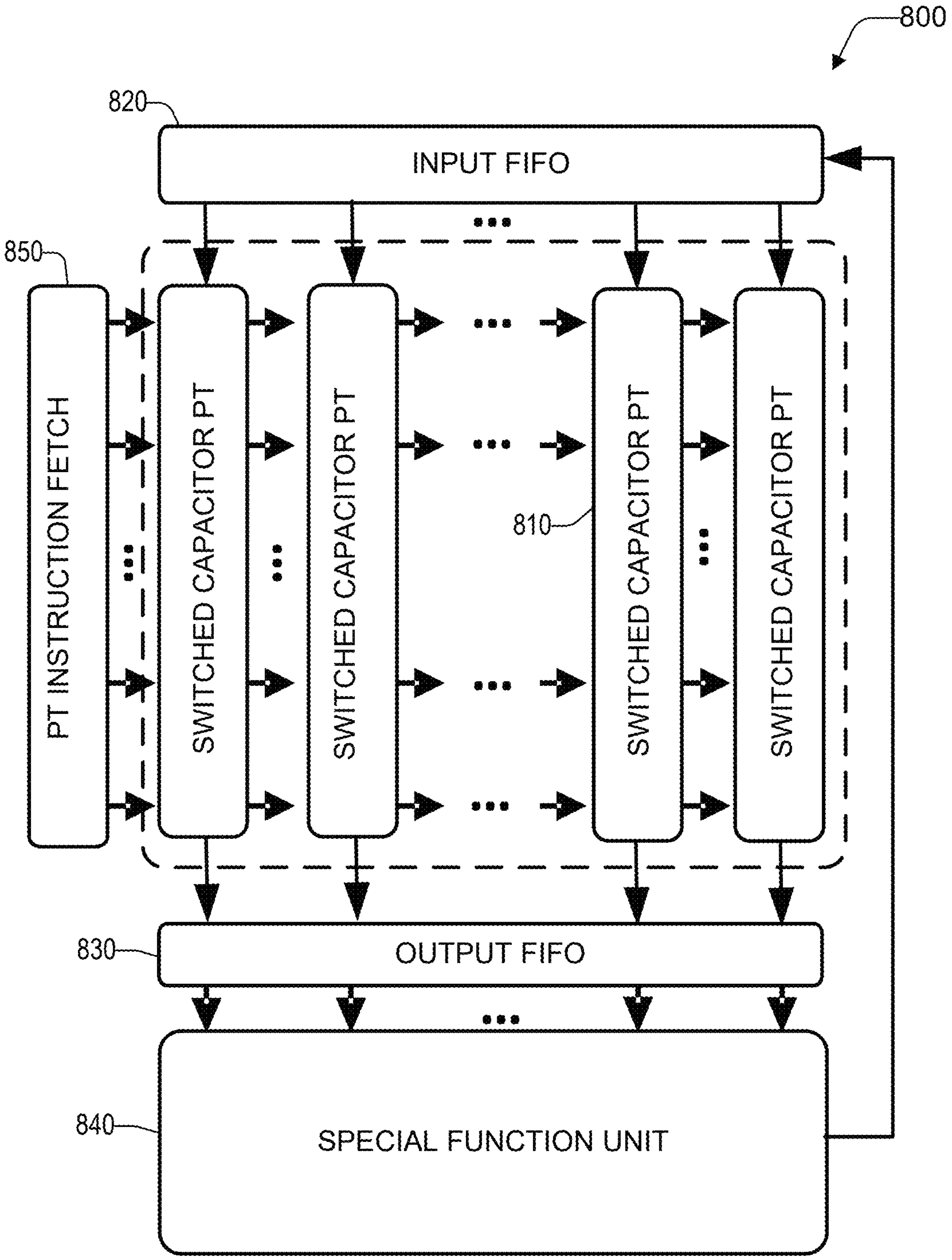
FIG. 8 is a DNN computing system, consistent with an illustrative embodiment.

Reference is now made to FIG. 8, which illustrates certain elements of a computing system 800 that implements a layer of a deep neural network. The system 800 includes a plurality of processing tiles (PTs) 810. Each PT 810 includes multiple circuits 100 of FIG. 1, where each circuit 100 performs the vector multiplication of a single neuron. Weights of a layer of the deep neural network are stored in the memory units 112 of the MAC units 110. Each PT 810 receives an input vector from an input FIFO buffer 820, each MAC unit 110 computes a dot product of the input vector and a vector of weights, and each ADC 120 converts the output of its corresponding MAC unit 110 to a digital value. The output of each ADC 120 is sent to an output FIFO buffer 830. A special function unit 840 includes a digital processor that performs computations corresponding to batch normalization, activation functions (e.g., sigmoid functions, rectified linear unit functions) and SoftMax functions. Outputs of one layer are sent to the input FIFO buffer 820 as an input vector for the next layer. A vector of weights for the next layer is also sent to the input FIFO buffer 820 and stored in the first subset of memory units 112 of the MAC unit 110, and another layer is processed.

A PT instruction fetch unit 850 fetches and issues instructions to the PTs 810 to control the operation of the PTs 1210, and the routing of input vectors and digital output signals. The PT instruction fetch unit 850 may also perform the functions of the global controller 160.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A system comprising:

an analog-to-digital converter (ADC) comprising a comparator having a first input and a second input;

a current source including an operational transconductance amplifier; and a controller configured to:

configure the operational transconductance amplifier with a first set of conductances;

use the current source to set a DC voltage at the first input;

reconfigure the operational transconductance amplifier with a second set of conductances; and enable the comparator and use the current source to create a voltage ramp at the second input.

2. The system of claim 1, further comprising an analog multiply and accumulate (MAC) unit, wherein:

the MAC unit comprises the current source; and the current source is configured to generate a current that is proportional to an analog quantity representing an output of the MAC unit.

3. The system of claim 2, wherein the MAC unit further comprises:

a first set of resistance-based memory units providing the first set of conductances; and a first set of activation switches for activating the first set of resistance-based memory units to configure the operational transconductance amplifier with the first set of conductances.

4. The system of claim 3, wherein:

the first set of activation switches is configured to receive a first set of control signals;

the first set of control signals represents a first vector;

states of the first set of resistance-based memory units represent a second vector; and the output of the MAC unit represents a dot product of the first vector and the second vector.

5. The system of claim 3, wherein:

each resistance-based memory unit of the first set of resistance-based memory units is operatively coupled between a common node and a corresponding activation switch of the first set of activation switches;

the operational transconductance amplifier is configured to maintain the common node at a read voltage; and the output of the MAC unit is a function of the read voltage and a sum of the conductances of the first set of resistance-based memory units.

6. The system of claim 3, wherein:

the ADC further comprises a time-to-digital converter operatively coupled to an output of the comparator;

the time-to-digital converter comprises an oscillator; and the controller is further configured to perform a tuning of the second set of conductances to adjust a slope of the voltage ramp to compensate for a variability of the oscillator.

7. The system of claim 6, wherein:

the MAC unit further comprises:

a second set of resistance-based memory units providing the second set of conductances; and a second set of activation switches for activating the second set of resistance-based memory units to reconfigure the operational transconductance amplifier; and the tuning comprises:

de-activating the first set of resistance-based memory units;

activating the second set of resistance-based memory units; and iteratively tuning resistive states of the second set of resistance-based memory units until the ADC produces a digital count that accurately represents a known voltage at the first input.

8. The system of claim 2, further comprising a digital processor configured to apply an activation function to an output of the ADC.

9. The system of claim 1, wherein the ADC further comprises:

a first integrator operatively coupled to the first input; and a second integrator operatively coupled to the second input;

wherein:

current from the current source is integrated by the first integrator to set the DC voltage at the first input; and current from the current source is integrated by the second integrator to create the voltage ramp at the second input.

10. The system of claim 9, wherein the controller is further configured to pre-charge the second integrator to a voltage that compensates for an offset of the comparator.

11. The system of claim 10, wherein pre-charging the second integrator comprises:

using the current source to set the first input at a nominal ramp start voltage; and using the current source to charge the second integrator to ramp up voltage at the second input until an output of the comparator reverses, whereby the second integrator is pre-charged to a voltage that compensates for the offset of the comparator.

12. The system of claim 11, wherein the ADC comprises:

a field effect transistor (FET) operatively coupling the current source to the second input;

an oscillator; and a switch operatively coupling the output of the comparator between the oscillator and a gate of the FET such that:

the FET is configured to connect the current source to the second input as the pre-charging of the second integrator begins; and a reversal of the output of the comparator causes the FET to disconnect the current source from the second input.

13. A method of operating a ramp-based analog-to digital converter (ADC) including a comparator, the method comprising:

configuring an operational transconductance amplifier with a first set of conductances;

using the operational transconductance amplifier as configured to set a DC voltage at a first input of the comparator;

reconfiguring the operational transconductance amplifier with a second set of conductances; and enabling the comparator and using the operational transconductance amplifier as reconfigured to create a voltage ramp at a second input of the comparator.

14. The method of claim 13, wherein:

the operational transconductance amplifier is provided by an in-memory multiply and accumulate (MAC) unit; and the first and second sets of conductances are provided by a first set of resistance-based memory units and a second set of resistance-based memory units of the MAC unit.

15. The method of claim 13, wherein:

the ADC further includes an oscillator operatively coupled to an output of the comparator; and the method further comprises tuning the second set of conductances to adjust a slope of the voltage ramp to compensate for a variability of the oscillator.

16. The method of claim 15, wherein the tuning comprises:

setting a known DC voltage at the first input of the comparator; and iteratively adjusting the second set of conductances until the ADC produces a digital count that accurately represents the known DC voltage.

17. The method of claim 13, further comprising pre-charging an integrator at the second input to a voltage that compensates for an offset of the comparator.

18. A method of increasing precision of a ramp-based analog-to digital converter (ADC) that is operatively coupled to an output of an in-memory multiply-and accumulate (MAC) unit, the method comprising:

setting a first input of a comparator of the ADC to a known voltage;

configuring an operational transconductance amplifier of the MAC unit with a set of resistance-based memory units of the MAC unit; and iteratively:

using the operational transconductance amplifier to apply a voltage ramp to a second input of the comparator; and tuning resistance states of the set of resistance-based memory units until the ADC produces a digital count representing the known voltage.

19. The method of claim 18, wherein:

the known voltage is a full scale input voltage; and the digital count is a maximum digital count.

20. The method of claim 18, further comprising pre-charging an integrator at the second input to a voltage that compensates for an offset of the comparator.

21. An analog-to-digital converter (ADC) comprising:

a comparator having a first input and a second input;

an integrator operatively coupled to the second input; and a controller configured to:

apply a nominal ramp start voltage at the first input;

apply a constant current to the integrator to create a voltage ramp at the second input, the voltage ramp starting at a voltage that is lower than the nominal ramp start voltage; and discontinue applying the current when an output of the comparator reverses;

whereby the integrator is pre-set to a voltage that compensates for an offset of the comparator.

22. The ADC of claim 21, wherein:

the ADC further comprises a field effect transistor (FET) having a gate and a drain-source path;

the drain-source path of the FET is operatively coupled to the second input; and the output of the comparator is operatively coupled to the gate of the FET.

23. A computing system, comprising a plurality of layers of a neural network, wherein each layer of the plurality of layers comprises:

a plurality of processing tiles;

a controller; and a digital processor programmed to apply activation functions to outputs of the plurality of processing tiles;

wherein:

each processing tile of the plurality of processing tiles includes a multiply and accumulate (MAC) unit, and a ramp-based analog-to-digital converter (ADC) operatively coupled to an output of the MAC unit, the ADC comprising a comparator;

the MAC unit of each processing tile of the plurality of processing tiles comprises a first set of resistance-based memory units and a second set of resistance-based memory units, and a current source including an operational transconductance amplifier;

for each processing tile of the plurality of processing tiles, the controller is configured to:

configure the operational transconductance amplifier with the first set of resistance-based memory units;

use the configured operational transconductance amplifier to set a DC voltage at a first input of the comparator;

reconfigure the operational transconductance amplifier with the second set of resistance-based memory units; and enable the comparator and use the reconfigured operational transconductance amplifier to create a voltage ramp at a second input of the comparator.

24. The computing system of claim 23, wherein for each processing tile of the plurality of processing tiles, the controller is further configured to iteratively tune resistive states of the second set of resistance-based memory units until the ADC produces a digital count that accurately represents a known voltage at the first input.

25. The computing system of claim 23, wherein for each processing tile of the plurality of processing tiles, the controller is further configured to pre- charge an integrator at the second input to a voltage that compensates for an offset of the comparator.

* * * * *